United States Patent [19]

Tsuneta et al.

[11] 4,001,018

[45] Jan. 4, 1977

[54] METHOD FOR MAKING A STRIPE SCREEN ON A FACE PLATE OF A CATHODE RAY TUBE BY ROTATING CORRECTION LENS

[75] Inventors: Asahide Tsuneta, Kawasaki; Shigeo Takenaka, Yokohama, both of Japan

[73] Assignee: Tokyo Shibaura Electric Co., Ltd., Kawasaki, Japan

[22] Filed: Mar. 8, 1976

[21] Appl. No.: 664,863

Related U.S. Application Data

[63] Continuation of Ser. No. 477,281, June 7, 1974.

[52] U.S. Cl. .................................... 96/36.1; 354/1
[51] Int. Cl.² ......................................... G03C 5/00
[58] Field of Search ...................... 96/36.1; 354/1

[56] References Cited

UNITED STATES PATENTS

| | | | |
|---|---|---|---|
| 2,936,682 | 5/1960 | Krawitz | 96/36.1 |
| 2,936,683 | 5/1960 | Burdick et al. | 96/36.1 |
| 3,386,354 | 6/1968 | Schwartz | 354/1 |
| 3,587,417 | 6/1971 | Balder et al. | 354/1 |
| 3,779,760 | 12/1973 | Miyaoka | 313/92 PD |
| 3,780,629 | 12/1973 | Barten et al. | 354/1 |
| 3,783,754 | 1/1974 | Takemoto et al. | 96/36.1 |
| 3,856,525 | 12/1974 | Inoue | 96/36.1 |
| 3,876,425 | 4/1975 | Geenen et al. | 96/36.1 |
| 3,906,515 | 9/1975 | Hosokoshi et al. | 354/1 |

*Primary Examiner*—Edward C. Kimlin
*Attorney, Agent, or Firm*—Oblon, Fisher, Spivak, McClelland & Maier

[57] ABSTRACT

In the manufacture of a color cathode ray tube equipped with an in-line electron gun for emitting a central electron beam and a pair of side electron beams, the inner surface of a face plate is exposed to make a stripe screen through a shadow mask using a light source and a correction lens. At an exposing stage corresponding to the central beam and at exposing stages corresponding to the pair of side beams a correction lens is commonly used. Relative azimuth of the correction lens between the exposing stage corresponding to the central beam and the exposing stages corresponding to the side beams is different by an angle of 90°.

3 Claims, 22 Drawing Figures

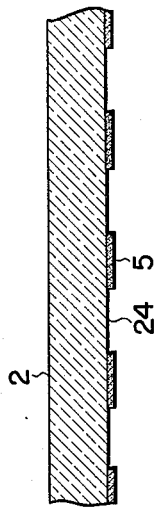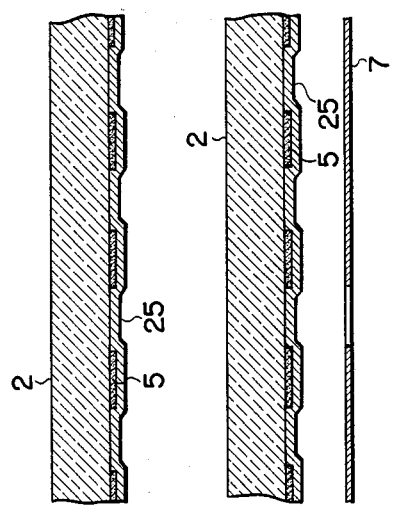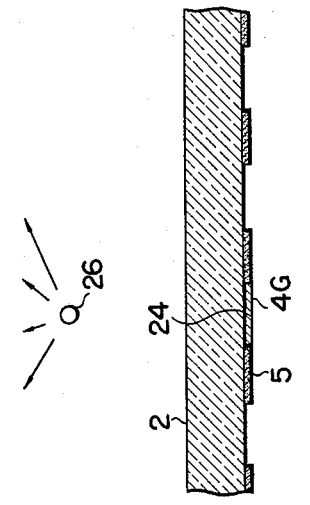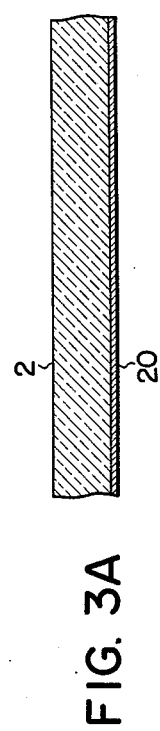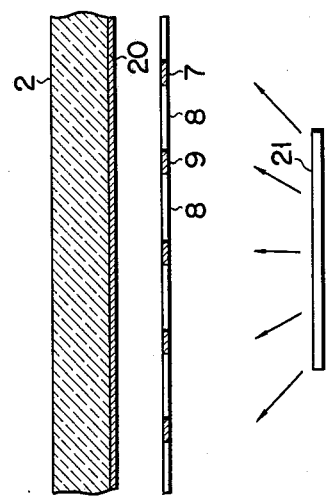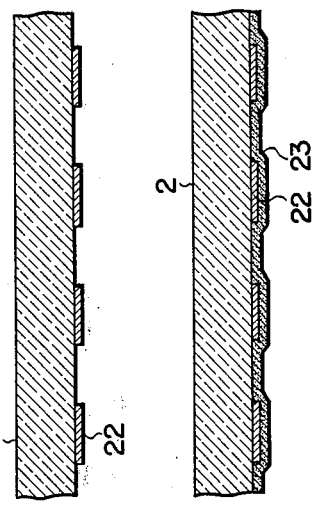
FIG. 3A FIG. 3B FIG. 3C FIG. 3D FIG. 3E FIG. 3F FIG. 3G FIG. 3H FIG. 4A-1
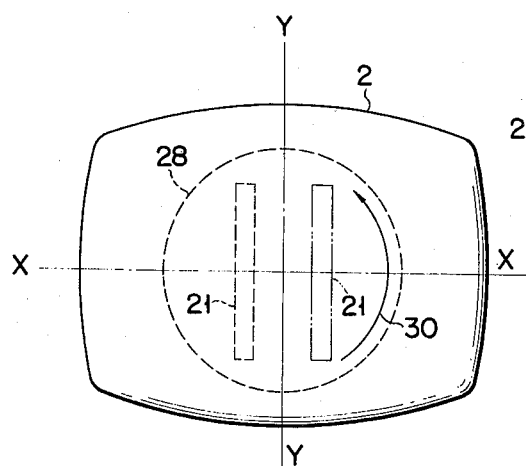
FIG. 4A-3
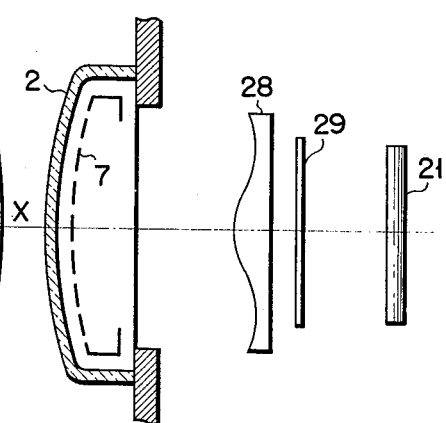
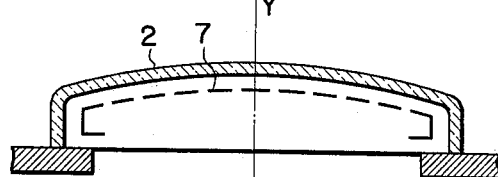
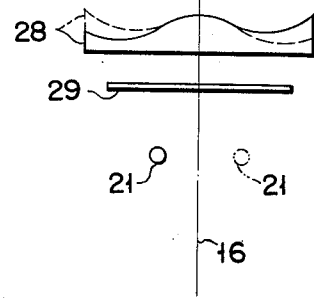
FIG. 4A-2

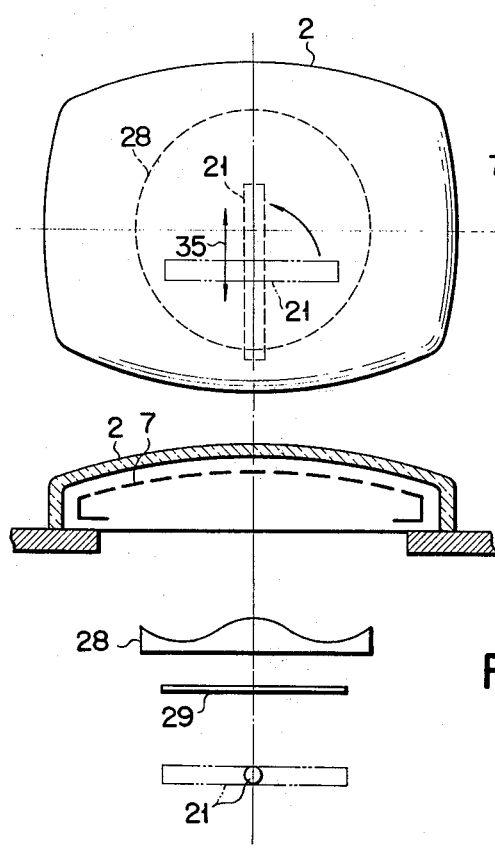
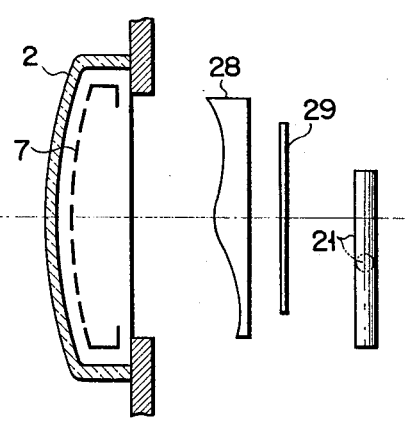
FIG. 4B-1
FIG. 4B-3
FIG. 4B-2

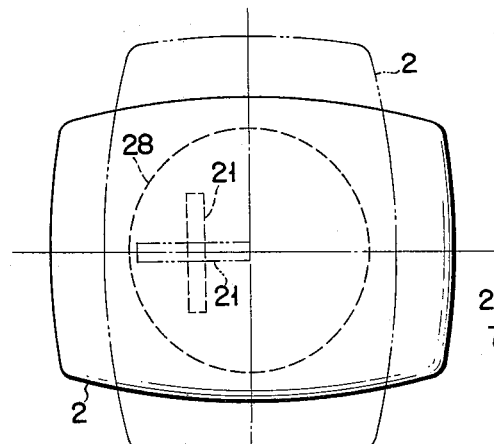
FIG. 5-1
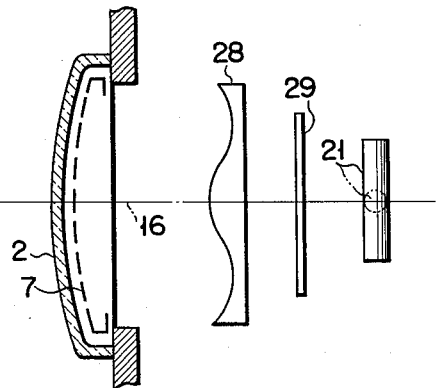
FIG. 5-3
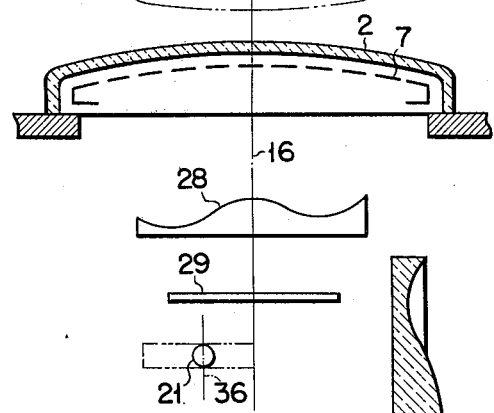
FIG. 5-2
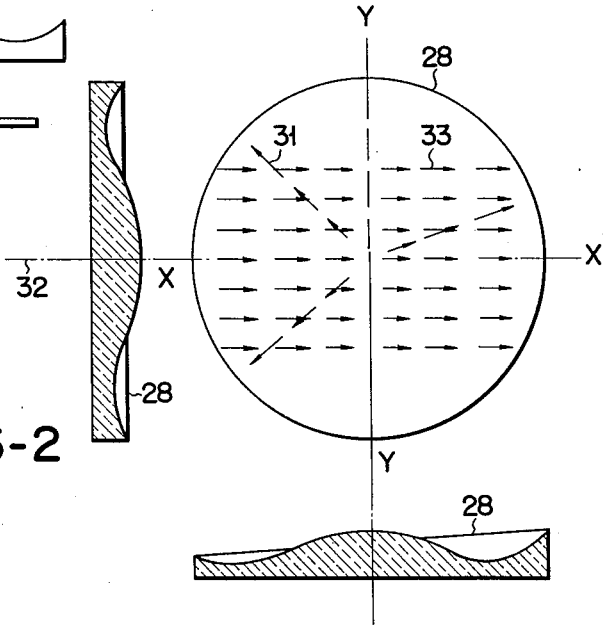
FIG. 6-1
FIG. 6-2
FIG. 6-3

METHOD FOR MAKING A STRIPE SCREEN ON A FACE PLATE OF A CATHODE RAY TUBE BY ROTATING CORRECTION LENS

This is a continuation, of application Ser. No. 477,281, filed June 7, 1974.

This invention relates to a method for making a stripe screen on a face plate of a color cathode ray tube equipped with an in-line electron gun.

There is well known a color cathode ray tube equipped with an in-line electron gun for emitting a central electron beam and a pair of side electron beams. Such a color cathode ray tube has a luminescent screen 3 comprising blue, green and red emitting phosphor stripes 4B, 4G and 4R formed on the inner surface of a face plate 2 and light-absorbing stripes 5 formed between the phosphor stripes as shown in FIG. 1. The phosphor stripes and light-absorbing stripes are formed in a direction perpendicular to a plane on which the electron guns 6B, 6G and 6R constituting an in-line gun assembly are arranged. The central electron gun 6G is located on the axis of the tube and the pair of side electron guns 6B and 6R are symmetrically arranged with respect to the central electron gun 6G. Between the electron guns 6B, 6G, 6R and the face plate 2, there is disposed a shadow mask 7 mounted in the face plate 2 and having a plurality of slit apertures 8 arranged along the length of the phosphor stripes with bridges 9 left between the slit apertures. The slit apertures 8 are formed substantially over the entire surface of the shadow mask 7.

In the above-mentioned cathode ray tube 1, if the widths of the light-absorbing stripes 5 and phosphor stripes 4B, 4G, 4R by which the brightness of a luminescent screen is greatly affected are not formed with a desired balance over the entire surface of the screen, a white-color reproducibility is prominently impaired even if each electron beam is correctly incident through the shadow mask 7 onto the corresponding phosphor stripes.

Where the luminescent screen 3 of a cathode ray tube 1 is formed, light-absorbing stripes 5 are usually formed prior to the formation of phosphor stripes. Since the width of the phosphor stripes contacted with the face plate is determined by the width of the light-absorbing stripes, the brightness of the reproduced picture image is controlled to a greater extent by the width of the light-absorbing stripes. Consequently, the width of the light-absorbing stripes should be strictly formed, as desired, over the entire surface of the screen.

Where a luminescent screen of a color cathode ray tube is formed, a photographic process using an exposure device 10 as shown in FIG. 2 is generally utilized. That is, an assembly consisting of the face plate 2 having a photosensitive layer 11 formed on its inner surface and the shadow mask 7 fixed in an approximately parallel relation to the face plate is positioned on the exposure device 10. The inner surface of the face plate 2 is exposed through a correction lens 13 and correction filter 14 by a light source 12 located on the bottom of the exposure device at a position corresponding to a deflection center, for example, of an electron beam. The correction lens 13 is required for optical correction by which the optical path of light is caused to correspond to the path of electron beam, while the correction filter 14 is required to adjust light distribution on the inner surface of the face plate.

Where a luminescent screen of a cathode ray tube equipped with in-line gun assembly is formed, since a central electron gun is located substantially coaxially with the tube axis, there is only required, as the optical correction related with the central electron beam, the radial correction for the deflection characteristic by which the deflection center of electron beam shifts toward the luminescent screen with an increasing angle of deflection. As the optical correction for the pair of side beams there is required, in addition to the radial correction, degrouping correction by which the displacement of the deflection center in a direction perpendicular to the tube axis due to the presence of the dynamic convergence magnetic field is compensated. For this reason, two kinds of correction lenses, one for the central beam and one for a pair of side beams, are conventionally required to form the luminescent screen of color cathode ray tube equipped with an in-line gun. This means that at least two separate exposure devices are required from the standpoint of the productivity of cathode ray tubes.

An exposure device used in forming light-absorbing stripes which define those areas corresponding to phosphor stripes emitting light upon receipt of a central electron beam has a light source located on a tube axis i.e. on the central axis of the face plate, a correction filter and a correction lens for radial correction with respect to the central beam. On the other hand, an exposure device used in forming light-absorbing stripes which define those areas corresponding to phosphor stripes emitting light upon receipt of a pair of side electron beams has a light source located off the tube axis so as to correspond to the side beam, a correction filter and a correction lens for radial correction and degrouping correction with respect to the side beams. As the exposure device for the pair of side beams, use may be made of one kind of exposure device capable of relatively rotating an optical system (a light source, correction lens and correction filter) and an illuminated system (a face plate mask assembly) by an angle of 180° about a tube axis with respect to each other.

The width of light-absorbing stripes — which define the width of the spaces between the light absorbine stripes and between which phosphor stripes are to be later formed — is determined by light amount, exposure time, light distribution etc. The light amount and exposure time only can be accurately controlled even if separate exposure devices are used. It is very difficult to obtain completely the same light transmission characteristics with respect to correction filters used in separate exposure devices.

In the conventional method, therefore, the spaces between light-absorbing stripes into which there are formed phospor stripes emitting light by a central electron beam undesirably tend to have different widths from the spaces between light-absorbing stripes into which there are formed phosphor stripes emitting light by a pair of side electron beams. This adversely affects the white color reproducibility of a reproduced image.

It is accordingly the object of this invention to provide a method for making a stripe screen on the inner surface of a face plate, in the manufacture of a color cathode ray tube including an in-line gun assembly for emitting a central electron beam and a pair of side electron beams and a face plate having phosphor stripes formed on the inner surface thereof, in which that width of phosphor stripes determining the brightness of a reproduced image are formed with a desired balance over the entire surface of the face plate.

The method according to this invention for making the stripe screen by exposing with a linear light source through the shadow mask and correction lens arranged between the linear light source and the shadow mask is characterized in that a correction lens and a linear light source are commonly used at each exposing stage for making the stripe screen, relative azimuth of the correction lens between the exposing stage corresponding to said central beam and the exposing stages corresponding to said side beams being different by an angle of 90°, the linear source of which direction is coincide with the direction of the stripes on the screen, being shifted to corresponding position to each electron beam at every exposing stages.

This invention is further explained with reference to the accompanying drawings:

FIGS. 3A to 3H show steps for forming a luminescent screen;

FIGS. 4A-1 to 4A-3 are a plan view, front view and side vide, respectively, for explaining in connection with a pair of side beams an exposure method according to this invention;

FIGS. 4B-1 to 4B-3 are a plan view, front view and side view, respectively, for explaining in connection with a central beam the exposure method according to this invention;

FIGS. 5-1 to 5-3 are a plan view, front view and side view, respectively, for explaining in connection with a central beam the exposure method according to this invention; and FIGS. 6-1 to 6-3 are a plan view, cross-sectional front view and cross-sectional side view, respectively, of a correction lens used in the exposure method according to this invention.

Figure 1:
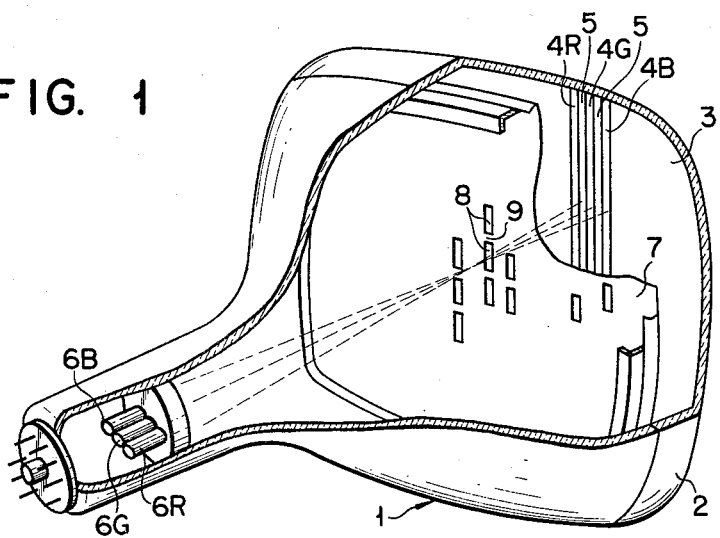
FIG. 1 is a perspective view, partly broken away, showing a color cathode ray tube equipped with in-line arranged three electron guns.
Figure 2:
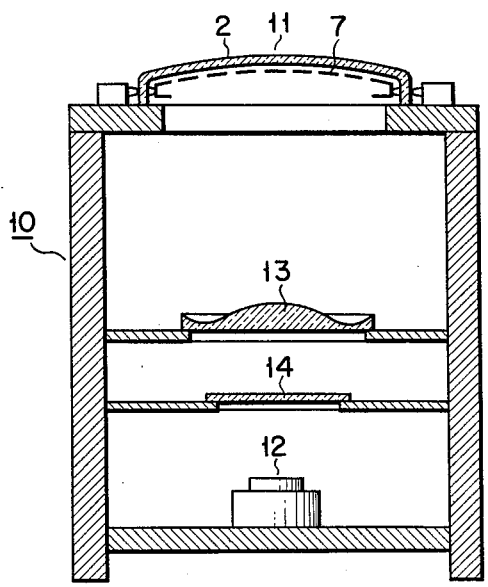
FIG. 2 is a cross-sectional view of an exposure device used in forming a luminescent screen of a color cathode ray tube.

Let us explain first a method for forming a luminescent screen and then an exposure method according to this invention.

As shown in FIG. 3A a light sensitive layer 20 such as polyvinyl alcohol (PVA) containing, for example, ammonium dichromate is first formed on the inner surface of a face plate 2. Then, as shown in FIG. 3B, the inner surface of the face plate 2 is exposed through a shadow mask 7 by a light source 21. As the light source 21 use is made of a linear light source so as to form light-absorbing stripes 5 without interrupted portions corresponding to bridges 9 provided between mask apertures 8. The exposure is sequentially effected once (three times in all) each time the light source is placed at a position corresponding to a deflection center of each electron beam. In a conventional method, when exposure is effected, one exposure device is used for a central electron beam and the other exposure device is used for a pair of side beams.

After completion of exposure the mask 7 is removed from the face plate 2. The PVA layer is developed and the unexposed portions of the PVA layer are removed to form PVA stripes 22 as shown in FIG. 3C. In this figure the PVA stripes 22 are lengthwise formed in a direction perpendicular to a paper surface. As shown in FIG. 3D, a light-absorbing layer 23 such as graphite pigment is formed on the inner surfaces of the face plate. The PVA stripes 22 are dissolved, for example, by a hydrogen peroxide solution and subsequently the PVA stripes 22 and portions of the light-absorbing material 23 overlying the PVA stripes are flushed with warm water. As a result, the light-absorbing stripes 5 are formed, as shown in FIG. 3E, with the portions of the PVA stripes 22 left as spaces 24 between the light absorbing stripes. Then, a phosphor slurry layer 25 having green phosphor particles dispersed into dichromated polyvinyl alcohol solution is formed as shown in FIG. 3F. A light is projected through the mask 7 to the inner surface of the face plate 2 using a light source 26 located at a position corresponding to the deflection center of the central electron beam which impinges on the green phosphor stripes. After exposure, the mask 7 is removed from the face plate 2 and the face plate is subject to development and the unexposed portions of the face plate is removed to form green phosphor stripes 4G, as shown in FIG. 3H, between the predetermined light-absorbing stripes.

The same processes as in the case of the green phosphor stripes are repeated with respect to blue phosphor stripes and red phosphor stripes.

In the above-mentioned method for forming the stripe screen, the light-absorbing stripes are formed prior to the formation of the phosphor stripes. The reverse processes are also possible. However, it is preferred to form the light-absorbing stripes prior to the formation of the phosphor stripes, since the edges of the light-absorbing stripes shown in FIG. 3E can be trimly formed. In the above-mentioned method two separate exposure devices are used, as in the case of the prior art, in forming light-absorbing stripes and phosphor stripes. Though one exposure device may be used in this case, it is preferred to use two exposure devices taking the productivity of cathode ray tubes into consideration. Where light-absorbing stripes are beforehand formed, the width of the light emitting area — the width of the portion contacted with the face plate — of phosphor stripes is defined by the width of the spaces between the light-absorbing stripes and, therefore, the phosphor stripes are allowed to have the edges laid on the light-absorbing stripes. This means that the width of the phosphor stripes is not required to be so strictly formed as the width of the light-absorbing stripes.

Let us now explain an exposure method using in forming light-absorbing stripes.

As shown in FIGS. 4A and 4B, the linear light source 21 is so disposed that the lengthwise direction thereof is coincided with the lengthwise direction of stripes to be formed on the screen. The linear light source 21 is used to prevent appearance of the shadow of bridges of the shadow mask 7 on the screen and deposit phosphor material in the form of stripe on the face plate 2. As a correction filter 29 there may be used one having the same light transmitting characteristic as a conventional correction filter. For example, the correction filter has its light transmission factor radially graded so that the transmission factor is increased toward the peripheral portion thereof.

A correction lens 28 is fundamentally required to have radial correction and degrouping correction capabilities for a pair of side electron beams. Since, however, a correction lens used in forming light-absorbing stripes elongated in a direction perpendicular to a plane on which electron guns are arranged requires no degrouping correction capability in a direction of the length of the stripes, radial correction component 31 and degrouping correction component 33 of the correction lens 28 are respectively formed symmetrically with respect to a axis 32, as shown in FIGS. 6-1 to 6-3. In practice, however, the correction lens may have a slight degrouping correction component formed in a direction Y-Y perpendicular to the direction X—X in which the degrouping correction component 33 is formed.

At the exposing stage for forming light-absorbing stripes corresponding to one side beam, the correction lens 28 is so disposed that, as shown in FIGS. 4A-1 to 4A-3, the degrouping correction component forming direction X-X or the symmetrical axis 32 is aligned with the plane of in-line arranged three beams. The light source 21 is located in a position corresponding to one side beam. Where light-absorbing stripes corresponding to the other side beam are formed, the optical system including the light source 21, correction lens 28 and correction filter 29 is rotated by an angle of 180° about the center axis 16 of the face plate 2, as indicated by an arrow 30 in FIG. 4A-1, with respect to the face plate 2 and mask 7. Consequently, the light source 21 has its position shifted to a position corresponding to the other side beam. In this case, the face plate-mask 7 assembly may be rotated by an angle of 180° with respect to the optical system.

Where light-absorbing stripes corresponding to the central beam are formed, the optical system is rotated by an angle of 90° with respect to the face plate 2 and mask 7 from a position for one side beam as shown in FIGS. 4B-1 to 4B-3 and only the light source 21 is further rotated by an angle of 90°. As a result, the light source 21 is located at a position to correspond to the central beam as indicated in a broken line. However, the position of the light source 21 is not symmetrical with respect to the center of the face plate and the stripes are likely to be gradually varied in width from one end to the other end and it is therefore desirable to slide the light source 21 in a direction of the stripes as indicated by an arrow 35 in FIG. 4B-1. At the exposing stage corresponding to the central beam, it is possible to rotate the face plate 2 and mask 7 by an angle of 90° as shown in FIG. 5-1, from a relative position in which the face plate 2, mask 7 and light source 21 are occupied at the exposing stages corresponding to side beams and to rotate the light source 21 by an angle of 90° about its axis 36. A desired positional relation is also obtained between the optical system and the face plate-mask assembly when the correction lens 28 is rotated by an angle of 90° about the axis 16 and the light source 21 is shifted towards the central axis 16 of the face plate 2.

According to this invention, where light absorbing stripes corresponding to the central beam are formed, the the symmetrical axis of the correction lens is aligned perpendicularly with the plane of in-line arranged three beams. This does not present any problem because the light-absorbing stripes require accuracy in width only and require no accuracy in length at all. It is therefore possible to form, in desired positions, those light-absorbing stripes having a predetermined width which correspond to each electron beam by the same exposure device. After the formation of the light-absorbing stripes, therefore, respective phosphor stripes having a predetermined width can be formed in a well-balanced pattern over the entire surface of the screen. Consequently, it is possible to provide color cathode ray tubes having excellent color reproducibility.

Though the above-mentioned method has been explained in connection with color cathode ray tubes having phosphor stripes and light-absorbing stripes, this invention can also be applied to cathode ray tubes having tricolor phosphor stripes only.

What is claimed is:

1. In the manufacture of a color cathode ray tube comprising an in-line arranged three beam electron gun assembly for emitting a central electron beam and a pair of side beams, a tricolor stripe screen formed on the inner surface of a face plate, and a shadow mask mounted in the face plate and having a plurality of slit apertures, a method for making the stripe screen comprising exposing a linear light source having a lengthwise direction coincident with that of the stripes to be formed on the screen through the shadow mask and a correction lens having a symmetrical axis, the correction lens being arranged between the linear light source and the shadow mask, and commonly using the correction lens and the linear light source at exposing steps corresponding to the central beam and to the side beams for making the stripe screen by arranging the correction lens so that the direction of the symmetrical axis of the correction lens at the exposing step corresponding to the central beam is aligned perpendicularly with the plane of the in-line arranged three beams and by arranging the correction lens so that the direction of the symmetrical axis of the correction lens at the exposing steps corresponding to the side beams is aligned with the plane of the inline arranged three beams.

2. A method according to claim 1 wherein the stripe screen comprises light absorbing stripes.

3. A method according to claim 1 wherein the stripe screen comprises alternating phosphor stripes between light absorbing stripes.

* * * * *

UNITED STATES PATENT AND TRADEMARK OFFICE
CERTIFICATE OF CORRECTION

PATENT NO. : 4,001,018
DATED : January 4, 1977
INVENTOR(S) : Asahide Tsuneta et al It is certified that error appears in the above-identified patent and that said Letters Patent are hereby corrected as shown below: Add:

--[30] Foreign Application Priority Data

June 13, 1973    Japan................65782/1973--

Signed and Sealed this

Fourteenth Day of June 1977

[SEAL]

Attest:

RUTH C. MASON
*Attesting Officer*

C. MARSHALL DANN
*Commissioner of Patents and Trademarks*